(12) United States Patent
Inomata

(10) Patent No.: US 10,875,726 B2
(45) Date of Patent: Dec. 29, 2020

(54) WORK TRANSFER SYSTEM AND CONTROL METHOD THEREOF

(71) Applicant: NIDEC SANKYO CORPORATION, Nagano (JP)

(72) Inventor: Tetsuya Inomata, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 111 days.

(21) Appl. No.: 16/185,100

(22) Filed: Nov. 9, 2018

(65) Prior Publication Data
US 2019/0135556 A1 May 9, 2019

(30) Foreign Application Priority Data
Nov. 9, 2017 (JP) .................. 2017-216580

(51) Int. Cl.
| | | |
|---|---|---|
| *G06F 7/00* | (2006.01) | |
| *B65G 47/90* | (2006.01) | |
| *B25J 11/00* | (2006.01) | |
| *B25J 17/02* | (2006.01) | |
| *B25J 18/00* | (2006.01) | |
| *H01L 21/687* | (2006.01) | |
| *H01L 21/677* | (2006.01) | |
| *B25J 9/16* | (2006.01) | |

(Continued)

(52) U.S. Cl.
CPC ............ *B65G 47/905* (2013.01); *B25J 9/042* (2013.01); *B25J 9/1664* (2013.01); *B25J 11/0095* (2013.01); *B25J 17/025* (2013.01); *B25J 18/00* (2013.01); *G06N 20/00* (2019.01); *H01L 21/67766* (2013.01); *H01L 21/67778* (2013.01); *H01L 21/68707* (2013.01); *B65G 47/904* (2013.01); *B65G 2201/0297* (2013.01)

(58) Field of Classification Search
None
See application file for complete search history.

(56) References Cited

U.S. PATENT DOCUMENTS

| | | | |
|---|---|---|---|
| 6,270,619 B1 * | 8/2001 | Suzuki | ............ H01L 21/67161 118/719 |
| 2007/0018469 A1 * | 1/2007 | Gershenzon | ...... H01L 21/68707 294/103.1 |

(Continued)

FOREIGN PATENT DOCUMENTS

| | | |
|---|---|---|
| JP | S63301305 A | 12/1988 |
| JP | H08106319 A | 4/1996 |

(Continued)

*Primary Examiner* — Yolanda R Cumbess
(74) *Attorney, Agent, or Firm* — Cantor Colburn LLP

(57) ABSTRACT

A work transfer system may include cassettes to house a work; a processing apparatus; and a robot to load and unload the work. The robot may include a base, a base link connected to the base, an arm link coupled to the base link, an arm connected to the arm link, and a hand connected to the arm. The base link and the arm link are controlled so that a center a coupling shaft of the arm link and the arm moves along a straight line. The cassettes are parallel to the straight line. A via point is specified for each quadrant of coordinate system and the robot moves between stages that are a target of loading or unloading of the work and uses the via point as a via point when moving.

15 Claims, 2 Drawing Sheets

(51) Int. Cl.
*G06N 20/00* (2019.01)
*B25J 9/04* (2006.01)

(56) References Cited

U.S. PATENT DOCUMENTS

2009/0095111 A1* 4/2009 Kitahara .................. B25J 18/04
                                                              74/490.05
2019/0134814 A1* 5/2019 Inomata ................. G05B 19/00

FOREIGN PATENT DOCUMENTS

| JP | 2009148859 A | 7/2009 |
|---|---|---|
| JP | 5199117 B2 | 5/2013 |

* cited by examiner

WORK TRANSFER SYSTEM AND CONTROL METHOD THEREOF

CROSS REFERENCE TO RELATED APPLICATION

The present application claims priority under 35 U.S.C. § 119 to Japanese Application No. 2017-216580 filed Nov. 9, 2017, the entire content of which is incorporated herein by reference.

TECHNICAL FIELD

At least an embodiment of the present invention relates to a work transfer apparatus which is provided with an articulated robot and transfers a work, and a control method thereof.

BACKGROUND

For example, in a semiconductor manufacturing process, it is necessary to transfer a work, such as semiconductor wafer, between a cassette that houses the work and a work processing apparatus that performs a predetermined process on the work. In this case, it is necessary to load and(or) unload a work to a plurality of cassettes. Therefore, an articulated robot configured to mutually and rotatably couple plurality of arms and to transmit rotational force of a motor or the like to the arms to extend and contract same has been used. A work transfer system is composed of a plurality of cassettes in which a work is housed, a work processing apparatus, and an articulated robot, in which the work is stored. Each cassette loads a work to be stacked as in a shelf, and with this, multiple works can be housed in one cassette. One example of such cassette is FOUP (Front-Opening Unified Pod), which is a transfer/storage box with a front opening type cassette stipulated in SEMI (Semiconductor Equipment and Materials International) standard E47.1. One example of a configuration of the work transfer system is disclosed in Patent Literature 1. In the work transfer system disclosed in Patent Literature 1, a plurality of cassettes are arranged in one row in a horizontal plane, a work processing apparatus is arranged at a position facing an arrangement of this plurality of cassettes, and a horizontal articulated robot is installed in an elongated space sandwiched by the arrangement of the cassettes and the work processing apparatus.

As a semiconductor manufacturing process becomes more complicated, a number of cassette that a work transfer system must cope with increases, and with the miniaturization of semiconductor manufacturing equipment itself, it has been required to reduce an installation space of the work transfer system as much as possible. In such a situation, when a robot performs operation of transferring a work in such a way that an arm does not interfere with the surrounding walls or equipment, it is necessary to set multiple transfer via points for each stage by teaching or the like. The stage is a target of load and(or) unload of a work and is a generic name, including a cassette, a work processing apparatus, or the like. In other words, the stage is a device that is a source or a destination of the work. For example, Patent Literature 2 discloses a feature wherein when controlling a trajectory of a moving path of a robot's hand, a via point and a target point are set, and the hand is moved to the target point through the via point. As a particular example of transfer operation, there is return-to-origin. In this regard, Patent Literature 3 discloses a feature wherein, in order to perform a reliable return-to-origin, a virtual position exceeding an origin position is set as a target position and then an origin is set as the target position. In relation to setting a via point by teaching or the like, Patent Literature 4 discloses a feature wherein when a robot can take two or more target positions, a trajectory is branched in accordance with an input signal from a peripheral device. In addition, instead of setting multiple transfer via points by teaching, it is also possible to find a safe path between stages by computation.
[Patent Literature 1]
Japanese Patent Application No. 5199117
[Patent Literature 2]
Japanese Patent Application No. 63-301305
[Patent Literature 3]
Japanese Patent Application No. 2009-148859
[Patent Literature 4]
Japanese Patent Application No. 08-106319

Performing teaching work for each stage to determine a transfer path requires its own work resources, and if a robot is not actually activated, existence or nonexistence of interference cannot be checked, which leads to an increase in a work time. In a case where a safe path is found by computation, there is a problem that a complicated program and parameters are required, and thus resources are required for their development, and a computation time also cannot be ignored. Accordingly, in either technique, as a number of via points in a movement between stages increases, a time required for actual transfer operation becomes longer.

SUMMARY

At least an embodiment of the present invention provides a work transfer system which can find a safe transfer path with only a minimum number of via points that are set in teaching without requiring computation by a complicated program, and a control method thereof.

The work transfer system of at least an embodiment of the present invention comprises plurality of cassettes configured to house a work; an work processing apparatus configured to process the work; and a horizontal articulated robot configured to load and(or) unload the work to the plurality of cassettes, wherein the horizontal articulated robot comprises a base, a base side link rotatably connected to the base, an arm section side link coupled to the base side link, an arm section freely rotatably connected to the arm section side link, and a hand section freely rotatably connected to the arm section to hold the work, wherein the base side link and the arm section side link constitute a link mechanism configured to control a movement locus of a center point of a coupling shaft coupling the arm section side link and the arm section to correspond to a predetermined straight line, wherein the plurality of cassettes are arranged parallel to the predetermined straight line and constitute one side of a boundary defining a working area of the horizontal articulated robot, wherein the work processing apparatus is arranged at any position on the boundary of the working area, wherein with a center of rotation of the base side link with respect to the base as an origin, a via point is specified for each quadrant of an XY orthogonal coordinate system so that one of two opposite directions parallel to the predetermined straight line is an X-axis positive direction in the XY orthogonal coordinate system, and wherein the horizontal articulated robot moves between stages that are a target of load and(or) unload of the work and uses the specified via point as a via point when moving.

In such a work transfer system, the specified via point for each quadrant can be used as a starting point of movement in the quadrant, and thus when moving to a target point in the quadrant, only the interference between the specified via point and the target point should be considered, and teaching of a transfer path and safety confirmation become easy. Also, when moving from a target point of a quadrant to another quadrant, with regard to a moving area in the quadrant to which the target point belongs, only the interference between the target point and the specified via point should be considered, and teaching and safety confirmation become easy.

In the work transfer system of at least an embodiment of the present invention, the specified via point of each quadrant is prestored in the horizontal articulated robot, for example, at the time of shipment, as being unique to the horizontal articulated robot. With this configuration, movement between the specified via points can be treated as teaching-completed and the movement to the specified via point can be carried out only by a move instruction to each quadrant without teaching. This makes safety confirmation easier.

A control method of the work transfer system of at least an embodiment of the present invention is a control of a work transfer system comprising plurality of cassettes configured to house a work, a work processing apparatus configured to process the work, and a horizontal articulated robot configured to load and(or) unload the work to the plurality of cassettes. The horizontal articulated robot comprises a base, a base side link rotatably connected to the base, an arm section side link coupled to the base side link, an arm section freely rotatably connected to the arm section side link, and a hand section freely rotatably connected to the arm section to hold the work, and moving between stages that are a target of load and(or) unload of the work. The base side link and the arm section side link constitute a link mechanism configured to control a movement locus of a center point of a coupling shaft coupling the arm section side link and the arm section to correspond to a predetermined straight line. The plurality of cassettes are arranged parallel to the predetermined straight line and constitute one side of a boundary defining a working area of the horizontal articulated robot, and the work processing apparatus is arranged at any position on the boundary of the working area. With a center of rotation of the base side link with respect to the base as an origin, a specified via point is determined for each quadrant of an XY orthogonal coordinate system so that one of two opposite directions parallel to the predetermined straight line is an X-axis positive direction in the XY orthogonal coordinate system, and the horizontal articulated robot is controlled to go through one or more of the specified via point when the horizontal articulated robot moves between two stages in the work transfer system.

In such a control method, the specified via point for each quadrant can be used as a starting point of movement in the quadrant, and thus when moving to a target point in the quadrant, only the interference between the specified via point and the target point should be considered, and teaching of a transfer path and safety confirmation become easy and the work transfer system can also be easily controlled. Also, when moving from a target point of a quadrant to another quadrant, with regard to a moving area in the quadrant to which the target point belongs, only the interference between the target point and the specified via point should be considered, and teaching and safety confirmation become easy.

In at least an embodiment of the present invention, that the specified via point is set for each quadrant to fulfill all of three conditions, for example:

(1) no interference occurs by the horizontal articulated robot when moving by point to point (PTP; Point to Point) operation between specified via points of different quadrants;

(2) no interference occurs by the horizontal articulated robot when moving by PTP operation between the specified via point and a return-to-origin position; and (3) no interference occurs by the horizontal articulated robot when moving by PTP operation between a standby/retracted position for any stage within the quadrant and the specified via point of the quadrant.

In this regard, however, depending on the structure, layout, and circumstances of each component of the work transfer system, a certain degree of effect can be expected without fulfilling one or two conditions. When condition (1) is fulfilled, safe PTP operation with a minimum number of via points and no interference is guaranteed between the specified via points. When condition (2) is fulfilled, safe PTP operation with a minimum number of via points and no interference is guaranteed between the specified via point and the return-to-origin position. When condition (3) is fulfilled, safe PTP operation with a minimum number of via points and no interference is guaranteed between a standby/retracted position for any stage and the specified via point. If the specified via point fulfills conditions (1)-(3), since safe PTP operation is guaranteed in a section corresponding to a condition fulfilled, it is only necessary to input a PTP operation command as teaching, and it is also possible to omit checking whether interference occurs. If two or more of the conditions (1)-(3) are fulfilled, there will be more sections in which safe PTP operation is guaranteed, thereby making teaching and safety confirmation easier.

In at least an embodiment of the present invention, it is possible that, with regard to a stage being rotated in a counterclockwise direction or a clockwise direction for a constant angle from the X-axis positive direction when viewed from the origin, one of a specified via point of a 1st quadrant and a specified via point of a 4th quadrant is selected as the via point for the stage, and with regard to a stage being rotated in a counterclockwise direction or a clockwise direction for a constant angle from an X-axis negative direction when viewed from the origin, one of a specified via point of a 2nd quadrant and a specified via point of a 3rd quadrant is selected as the via point for the stage. With this configuration, in an area near an end in a longitudinal direction of a working area, even if there are mechanical constraints or the like on a rotation angle between the arm section and the hand section, such constraints are avoided, and a suitable transfer path can be easily obtained with a minimum number of set points.

In at least an embodiment of the present invention, that the predetermined straight line is positioned biased to either a side of the plurality of cassettes or a side farther away from the plurality of cassettes, with respect to a center line of a longitudinal direction of the working area. By configuring in this way, a movement range of a coupling part of the arm section and the arm section side link becomes biased to one of narrow working areas, and the arm section and the hand section hardly interfere with the surroundings with the rotation of the arm section, and the specified via point can be set so as to maintain a proper folding state of the hand section and the arm section.

In at least an embodiment of the present invention, suppose that the Y-axis positive direction is specified such that a Y-coordinate of an intersection point of the center line in the longitudinal direction of the working area and a Y-axis in the XY orthogonal coordinate system is negative when viewed from the origin, the attitude of the horizontal articulated robot in each quadrant can be followings. At specified via points of a 1st quadrant and a 2nd quadrant, the hand section is oriented in the Y-axis positive direction, and an extending direction of the hand section is inclined toward the Y-axis when viewed from a coupling position of the hand section and the arm section. At specified via points of a 3rd quadrant and a 4th quadrant, there is an opening angle between the hand section and the arm section, and the extending direction of the hand section is inclined in a range of 20° to 30° toward the Y-axis when viewed from the coupling position of the hand section and the arm section. By configuring the attitude at each specified via point in this way, a moving time from the specified via point can be shortened as much as possible while preventing occurrence of interference. The attitude at the specified via point of the 1st quadrant and the attitude at the specified via point of the 2nd quadrant are usually set to be symmetrical with respect to the Y-axis. In addition, the attitude at the specified via point of the 3rd quadrant and the attitude at the specified via point of the 4th quadrant are also usually set to be symmetrical with respect to the Y-axis.

According to at least an embodiment of the present invention, in a work transfer system, a safe transfer path can be found with only a minimum number of via points that are set in teaching without requiring computation by a complicated program.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
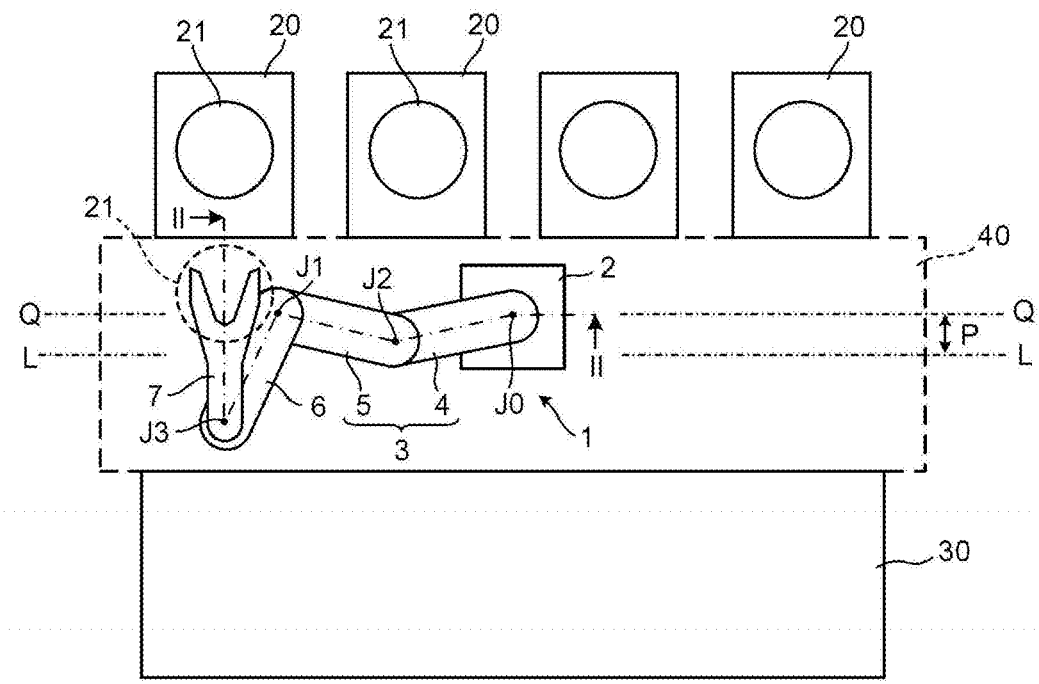
FIG. 1 is a plan view showing a work transfer system according to one embodiment of the present invention.

Next, an embodiment of the present invention will be described with reference to the drawings. FIG. 1 shows a work transfer system according to one embodiment of the present invention. This work transfer system includes an articulated robot 1, a plurality of cassettes 20 each of which houses a work 21, and a work processing apparatus 30 which executes a process on the work 21. The plurality of cassettes 20 are arranged side by side in one direction, and the work processing apparatus 30 is arranged so as to face an arrangement of the cassettes 20. An elongated rectangular area between the arrangement of the plurality of the cassettes 20 and the work processing apparatus 30 is a working area 40 in which the articulated robot 1 can move hands, arms and the like. The articulated robot 1 is installed in the working area 40 and can transfer the work 21 between the cassettes 20 and between the cassettes 20 and the work processing apparatus 30 by moving the links, arms, and hands. In the illustrated example, while four cassettes 20 are provided (i.e., four FOUPs), a number of the cassettes 20 is not limited to four.

Next, the articulated robot 1 used in this embodiment will be described. In this embodiment, the 3-linked horizontal articulated robot described in Patent Document 1 is used as the articulated robot 1. The articulated robot 1 transfers the work 21 between the cassettes 20 and between the cassettes 20 and the work processing apparatus 30. It is necessary to carry in/out the work 21 to/from the cassettes 20 and the work processing apparatus 30, that is, it is necessary to load and(or) unload the work in accordance with transfer. In this case, a front opening type such as FOUP is used as the cassettes 20, and therefore a direction in which the articulated robot 1 loads/unloads the work 21 becomes a direction orthogonal to an arrangement direction of the cassettes 20.

The articulated robot 1 includes a hand section 7 which holds the work 21, an arm section 6 which rotatably holds the hand section 7, a link mechanism 3 which rotatably holds an arm joint section J1 at a proximal end side of the arm section 6 and which operates a movement locus of the arm joint section J1 to correspond to a straight line almost parallel to the arrangement direction of the cassettes 20, and a base 2, in which a proximal end side of the link mechanism 3 is rotatably supported. The link mechanism 3 includes a base side link 4 which is positioned on a base 2 side and is rotatably held on the base 2 and an arm section side link 5 which is positioned on an arm section 6 side, and both links 4 and 5 are rotatably coupled to each other by a link joint section J2.

Figure 2:
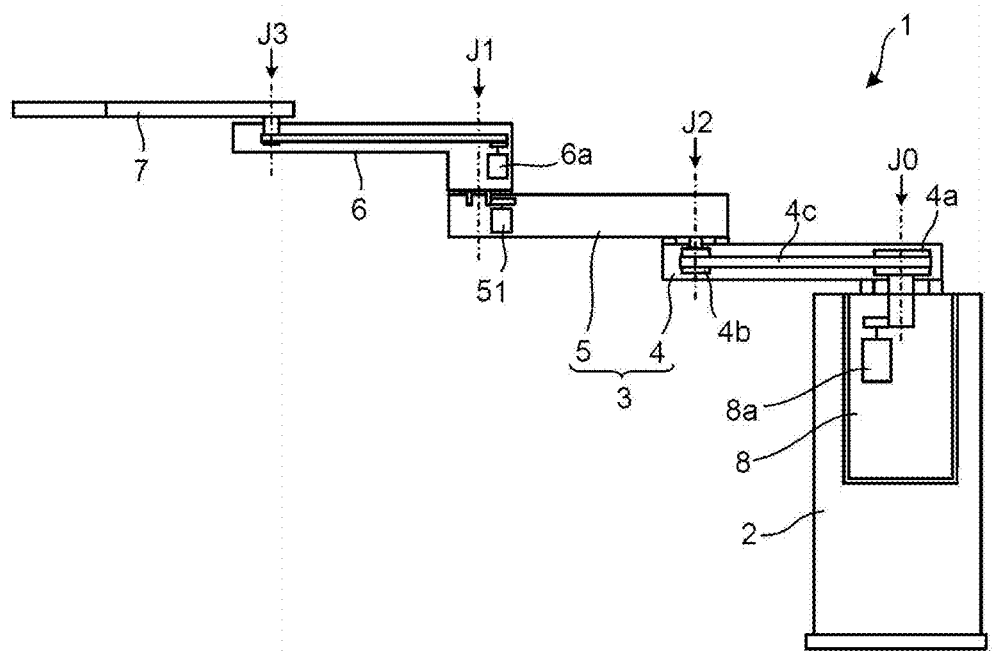
FIG. 2 is a schematic cross-sectional view of an articulated robot taken along line II-II of FIG. 1.

FIG. 2 is a more detailed illustration of the articulated robot 1, with a vertical cross-sectional view of the base 2, the link mechanism 3, the arm section 6, and the hand section 7. The base 2 includes a lift cylinder 8 that is driven by a lift motor (not shown) and lifted in an up-and-down direction. The base side link 4 is coupled to the lift cylinder 8, and is rotatably held by a link mechanism motor 8a embedded in the lift cylinder 8, and can be lifted up and down with respect to the base 2 as the lift cylinder 8 is lifted up and down. A base side pulley 4a, an arm section side pulley 4b and a belt 4c are embedded in the base side link 4, and the belt 4c is bridged between the base side pulley 4a and the arm section side pulley 4b. A ratio of diameters of the base side pulley 4a and the arm section side pulley 4b is 2:1. The arm section side pulley 4b is coupled to the arm section side link 5. When the base side link 4 rotates about the center of rotation of the base side pulley 4a, a rotation angle ratio between the base side pulley 4a and the arm section side pulley 4b, i.e., the rotation angle ratio between the base side link 4 and the arm section side link 5 becomes 1:2. Furthermore, lengths of the base side link 4 and the arm section side link 5 are equal. As a result, in the link mechanism 3, a movement locus of a center point (arm joint section J1) of the coupling shaft which rotatably couples the arm section side link 5 and the arm section 6 is controlled to correspond to a predetermined straight line. In the figure, this predetermined straight line is indicated by a straight line Q. The arm section 6 is coupled to a tip of the arm section side link 5 and is rotatably held by an arm section motor 51 embedded in the arm section side link 5. In FIG. 2, for convenience of explanation, the arm section motor 51 is embedded in the arm section side link 5, but an installation position of the arm section motor 51 is not limited to this, and for example, the arm section motor 51 may be embedded in the arm section 6. The hand section 7 is coupled to a tip of the arm section 6 and is rotatably held by a frame motor 6a embedded in the arm section 6. A coupling center of the hand section 7 with respect to the arm section 6, i.e., the center of rotation of the hand section 7 is J3.

Figure 3:
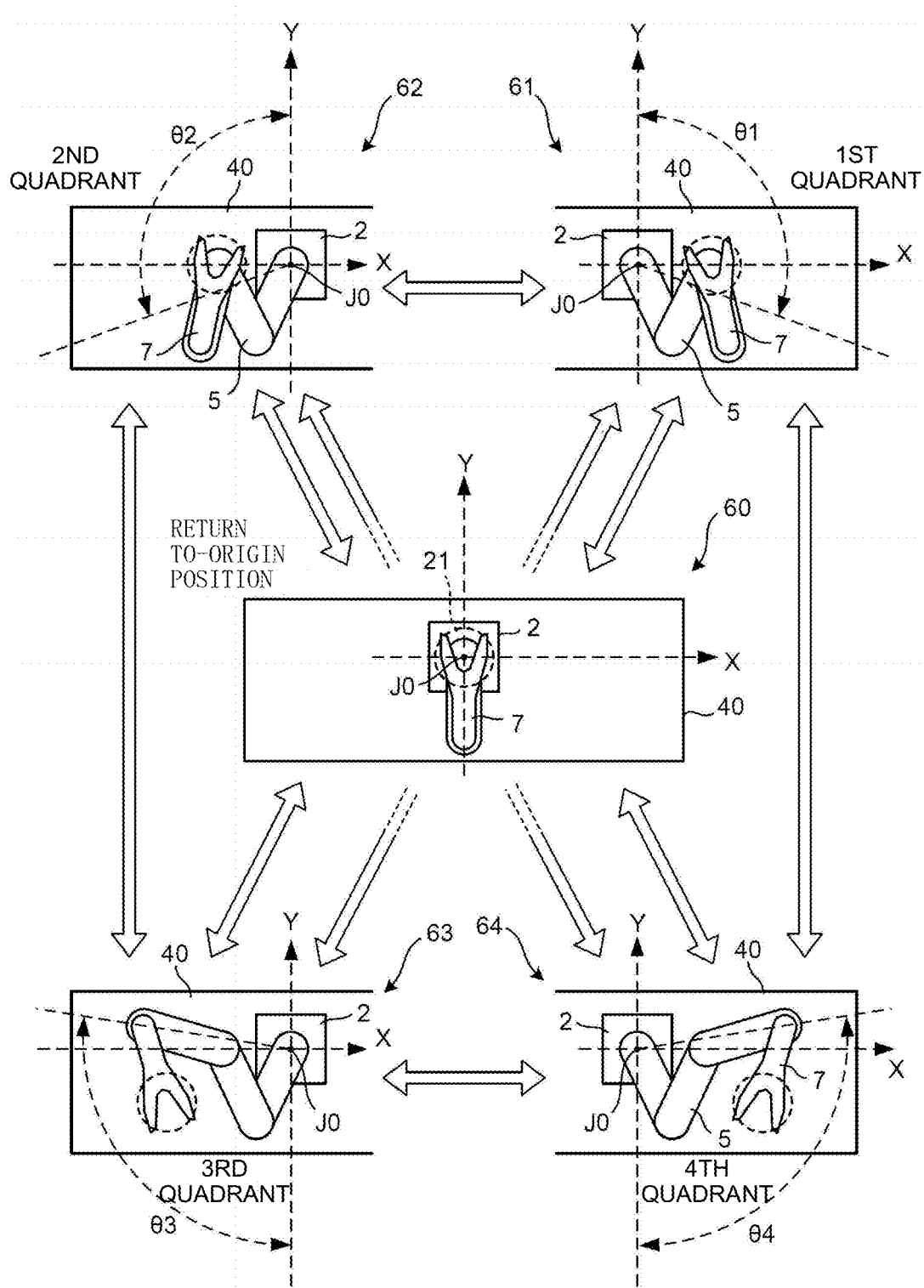
FIG. 3 is a plan view illustrating each specified via point and an attitude at the specified via point.

The articulated robot 1 is equipped with a robot controller 10 for driving the articulated robot 1 and controlling its operation. A teaching pendant 15 is connected to the robot controller 10 via a cable 16. The teaching pendant 15 is used by an operator in teaching the articulated robot 1, and for example, a jog operation command is input. A return-to-origin command is also given to the articulated robot 1 via the teaching pendant 15. FIG. 3 shows a configuration of the robot controller 10. The robot controller 10 includes a robot drive unit 11 which is a servo-control circuit for motors such as the arm section motor 51, the frame motor 6a, and the link mechanism motor 8a in the articulated robot 1, a computation unit 12 which generates a servo command on the basis of a command input to the articulated robot 1 and outputs the servo command to the robot drive unit 11 and performs a necessary computation or the like, an auxiliary memory unit 13 which stores data necessary for a process in the computation unit 12, and a communication unit 14 which is a communication interface with the teaching pendant 15. In particular, the computation unit 12 corresponds to a control means and calculates a transfer path on the basis of teaching data, and controls driving of the motors such as the arm section motor 51, the frame motor 6a, and the link mechanism motor 8a on the basis of the transfer path. In order to perform servo-control, the robot drive unit 11 is connected to each motor in the articulated robot 1 and position information is input from an encoder attached to each motor. Consequently, the computation unit 12 can recognize a coordinate of each part of the articulated robot 1 on the basis of the position information input from the encoder, and has a function to store the recognized coordinate in the auxiliary memory unit 13. Furthermore, the computation unit 12 has a function to store the teaching data in the auxiliary memory unit 13 each time teaching is performed for this articulated robot 1.

In this embodiment, the position of the base 2 of the link mechanism 3 of the articulated robot 1, i.e., the center of rotation J0 of the base side link 4 rotatably held in the base 2 and the arm joint section J1 which is the center of rotation position in the link mechanism 3 are positioned biased to a side of the arrangement of the cassettes 20 for a length P from an intermediate position between the apparatus 30 and the four cassettes 20. The intermediate position between the work processing apparatus 30 and the four cassettes 20 is also considered to be a center line L in a longitudinal direction of a working area 40. In addition, the link joint section J2 is configured so as to be bent and protruded on a side opposite to this biased position as the link mechanism 3 is driven. Consequently, even if a length of each section of the arm section 6 and the link mechanism 3 is increased when a number of cassettes 20 arranged along one long side of the working area 40 is increased, it is possible to prevent the link joint section J2 of the link mechanism 3 from contacting with the apparatus 30 or the cassettes 20. As a result, it is possible to prevent the work transfer system from being enlarged as a whole, and thus to save space. Here, while the center of rotation J0 of the base side link 4 and the arm joint section J1 are positioned biased closer to the arrangement of the cassettes 20 than the intermediate position (the center line L of the working area 40), on the contrary, the center of rotation J0 and the arm joint section J1 may be positioned biased closer to a side of the work processing apparatus 30. In this case, the movement locus of the arm joint section J1 is positioned biased closer to the side of work processing apparatus 30, and the link joint section J2 is bent and protruded more in the side of the cassettes 20 than the intermediate position.

The operation when the articulated robot 1 loads/unloads the work 21 to, for example, the cassettes 20 or the work processing apparatus 30 is basically the same as that described in Patent Literature 1. In the following description, the cassettes 20 and the work processing apparatus 30, which are targets of load and(or) unload of the work 21, are called stages. When loading the work 21 into the stage, the work 21 is transferred to a position in front of the stage in the working area 40 (standby/retracted position) in a state of being placed on the hand section 7. In a state where the work has been transferred to the standby position, the hand section 7 extends parallel to a direction in which the work 21 is loaded into the stage. Then, the hand section 7 moves in a loading direction to load the work 21. After that, the hand section 7 is moved to be in a direction opposite to the loading direction. A process for unloading the work 21 from the stage is performed in the same way as when the load is performed.

In the above description, while the work processing apparatus 30 has been arranged at a position opposite to the arrangement of the plurality of cassettes 20, the position of the work processing apparatus 30 is not limited to this, and may be arranged at any place surrounding the working area 40. For example, the work processing apparatus 30 can be arranged on a straight line for which the movement locus of the arm joint section J1 is extended. In addition, while it has been described that the plurality of cassettes 20 are arranged side by side, as long as the standby/retracted position is defined in the load and(or) unload, it is possible to arrange, for example, a machining device for machining the work 21 in addition to the cassettes 20. These machining devices also correspond to the stage.

When a number of the cassettes 20 increases or an arrangement of the work processing apparatus 30 becomes complicated, a number of transfer paths represented by a combination of a transfer source stage and a transfer destination stage in the transfer of the work 21 explosively increases. Meanwhile, it is required to reduce a space of the working area 40 where the articulated robot 1 is arranged and an arm section 6 and a hand section 7 can move and rotate, and as a result, teaching for determining a transfer path such that the arm section 6 and the hand section 7 do not collide with surrounding equipment is becoming more time consuming. Consequently, it is necessary to be able to determine an individual transfer path quickly and easily. As described above, the standby/retracted position when loading/unloading the work 21 to that stage is defined no matter what device, i.e., stage in/from which the work 21 is carried is. Then, in determination of the transfer path, it is only necessary to determine a movement locus between the stage and the standby/retracted position of that stage and the movement locus of the articulated robot 1 between the standby/retracted positions of two stages. In this embodiment, determination of a transfer path having a smaller number of via points boils down to the question that, when respective standby/retracted positions of two stages are given in the elongated rectangular working area 40, a number of the via points therebetween is made as small as possible. As a matter of course, in the transfer path to be determined, the arm section 6 and the hand section 7 of the articulated robot 1 should not collide with surrounding objects (the cassettes 20 and the work processing apparatus 30). For this purpose, it is only necessary to fulfill a condition that the arm section 6 and the hand section 7 should not exceed or touch a boundary of the working area 40. Although the working area 40 has been described to be an elongated rectangle here, as long as being an elongated area extending along a direction of a movement locus of an arm joint section J1 of the articulated robot 1, the working area 40 does not necessarily have to be rectangular. The working area 40 may have a shape such that a part of a rectangle is deformed. In particular, an end of the working area 40 in a longitudinal direction may be shaped like an arc, for example.

In this embodiment, therefore, an XY orthogonal coordinate system in which a center of rotation J0 of a base side link 4 of the articulated robot 1 is an origin and a direction parallel to a long side of the working area 40 is an X-axis positive direction is considered, focusing attention on each quadrant in this XY orthogonal coordinate system. In this case, either of two directions from the origin to both ends of the X-axis may be the X-axis positive direction. Then, a specified via point for each quadrant and an attitude of the articulated robot 1 at the specified via point are set. In the illustrated example, based on that the center of rotation J0 and a movement locus of the arm joint section J1 are arranged biased closer to the arrangement of the cassettes 20 than a center line L in a longitudinal direction of the working area 40, a direction from the center of rotation J0 to the arrangement of the cassettes 20 is a Y-axis positive direction. When the center of rotation J0 and the movement locus of the arm joint section J1 are biased in a direction farther away from the arrangement of the cassettes 20 than the center line L in the longitudinal direction of the working area 40, the direction farther away from the cassettes 20 may be defined as the Y-axis positive direction. In FIG. 3, a sign 60 shows a return-to-origin position of the articulated robot 1. At the return-to-origin position, the base side link 4, the arm section side link 5, the arm section 6 and the hand section 7 overlap with one another, and the overlap is aligned so as to be oriented in a −Y direction from the center of rotation J0 of the base side link 4.

The specified via point is introduced for the purpose of reducing a number of via points as much as possible when performing teaching of the transfer path. This specified via point set for each quadrant is defined to fulfill at least one of conditions:

(1) the articulated robot 1 can carry out transfer between specified via points of different quadrants by PTP operation without interfering with the surroundings;

(2) the articulated robot 1 can also carry out transfer between the specified via point and the return-to-origin position by the PTP operation without interfering with the surroundings; and (3) the articulated robot 1 can also carry out transfer between the standby/retracted position of any stage in a corresponding quadrant and its specified via point by the PTP operation without interfering with the surroundings. FIG. 3 shows that the PTP operation can be performed between the specified via points, or between the specified via point and the return-to-origin position, by means of the white two-way arrows.

In a horizontal articulated robot as used in this embodiment, in which a tip of a link (here, the arm joint section J1) is controlled to be parallel to the predetermined straight line, and the arm section 6 and the hand section 7 are respectively and rotatably mounted at an end of the tip of the link in this order, there is always a specified via point for each quadrant, that fulfills the above conditions (1)-(3) simultaneously. The PTP operation is possible if any of the above conditions (1)-(3) is fulfilled, and thus in teaching a transfer path, the PTP operation is possible in a section corresponding to any of the conditions. Therefore, at least for that section, the number of via points can be minimized. In addition, since a coordinate system that specifies a quadrant is specified by the center of rotation J0 of the base side link 4 and the predetermined straight line described above, the specified via point can be specified in accordance with only lengths of the link mechanism 3, the arm section 6, and the hand section 7 of the articulated robot 1. This makes it possible to set the specified via point at a time of shipment of the articulated robot 1, which facilitates an adjustment work of the articulated robot 1 at an installation site. In the following description, the specified via point fulfills the above conditions (1)-(3) simultaneously.

The specified via points of each quadrant will be described in details below. A sign 61 illustrates the specified via point of a 1st quadrant, and the specified via point of this 1st quadrant targets at the standby/retracted position of a stage in an angle range $\theta 1$ shown in the figure. The angle range $\theta 1$ is a range which is from a position slightly rotated in a clockwise direction from the X-axis positive direction to the Y-axis positive direction when viewed from the center of rotation J0 of the base side link 4. In the attitude of the specified via point of the first quadrant, the hand section 7 is oriented in the Y-axis positive direction and is either parallel to the Y-axis or slightly inclined from the Y-axis in a counterclockwise direction. A sign 62 shows the specified via point of the 2nd quadrant. The specified via point of the 2nd quadrant targets at the standby/retracted position of a stage in an angle range $\theta 2$, and is basically symmetrical to the specified via point of the 1st quadrant with respect to the Y-axis. However, in a case of a device in which arrangement of a layout or a stage is not symmetrical or in a case where a center of the working area 40 along the X-axis does not coincide with the origin position, the specified via points of the 1st quadrant and the 2nd quadrant are not necessarily symmetrical with respect to the Y-axis, and the hand section 7 at those points may respectively take an own attitude.

A sign 63 shows the specified via point of the 3rd quadrant. The specified via point of the 3rd quadrant targets at the standby/retracted position of a stage in an angle range $\theta 3$. The angle range $\theta 3$ is a range which is from a position slightly rotated in a clockwise direction from the X-axis negative direction to the Y-axis negative direction when viewed from the center of rotation J0 of the base side link 4. At the specified via point of the 3rd quadrant, the opening angle between the base side link 4 and the arm section side link 5 is slightly larger than that of the 1st quadrant. In a case where the hand section is configured to be overlapped with the arm section 6, it is necessary to rotate the hand section 7 to open when moving to any stage. In this regard, an angle of the arm section 6 with respect to the X-axis is smaller than that in ca case of the first quadrant, and thus a time required for the rotation of the hand section 7 becomes long. Therefore, at the specified via point of the 3rd quadrant, the opening angle is formed between the arm section 6 and the hand section 7 with a center of rotation J3 of the hand section 7 being interposed. The hand section 7 is configured such that an angle between the arm section 6 and the hand section 7 is an acute angle and is inclined about, for example, 20° to 30° with respect to the Y-axis. A sign 64 shows the specified via point of the 4th quadrant. The specified via point of the 4th quadrant is targets at the standby/retracted position of a stage in an angle range $\theta 4$, and is basically symmetrical to the specified via point of the 3st quadrant with respect to the Y-axis. However, in a case of a device in which arrangement of a layout or a stage is not symmetrical or in a case where a center of the working area 40 along the X-axis does not coincide with the origin position, the specified via points of the 3rd quadrant and the 4th quadrant are not necessarily symmetrical with respect to the Y-axis, and the hand section 7 at those points may respectively take an own attitude.

Here, focusing on the angle range θ1 at which the specified via point of the 1st quadrant targets, and the angle range θ4 at which the specified via point of the 4th quadrant targets, they overlap with each other at a position that is an end of the longitudinal direction of the working area 40. In a case where a transfer path from a stage having the standby/retracted position or to such a stage is considered at this overlapping position, in accordance with, for example, what kind of transfer is scheduled before and after, a specified point at which there is no waste in motion of the articulated robot 1 among specified via points having an overlapping target range may be selected. In the articulated robot 1, the hand section 7 cannot rotate about the center of rotation J3 with respect to the arm section 6 unrestrictedly, and often can rotate only within a range of, for example, ±270° from a state of being overlapped with the arm section 6. Consequently, there are times where it is automatically determined that one of two specified via points should be specified depending on the limitation of this rotation angle. There is also a similar overlap of angle ranges between the angle range θ2 at which the specified via point of the 2nd quadrant targets and the angle range θ3 at which the specified via point of the 3rd quadrant targets. Also, in this case, a same process as when the angle ranges overlap between the 1st quadrant and the 4th quadrant may be performed.

If there is an obstacle such as a stage door near a center part of the longitudinal direction of the working area 40, for example, near the position of the Y-axis, height information (e.g., lifting quantity of a lift cylinder 8 of the articulated robot 1) is set to a parameter specifying the specified via point, thereby allowing the articulated robot 1 to move in such a way as to avoid this obstacle when moving between quadrants.

Next, teaching of a transfer path in a work transfer system of this embodiment will be described. Teaching in a case where the work 21 is loaded/unloaded to the cassettes 20 and the work processing apparatus 30 that are provided adjacent to the working area 40, and the work is transferred between the stages will be described. In this embodiment, as described above, the specified via point set for each quadrant fulfills a condition:

(1) the articulated robot 1 can carry out transfer between specified via points of different quadrants by point to point (PTP) operation without interfering with the surroundings;

(2) the articulated robot 1 can also carry out transfer between the specified via point and the return-to-origin position by the PTP operation without interfering with the surroundings; and (3) the articulated robot 1 can also carry out transfer between the standby/retracted position of any stage in a corresponding quadrant and its specified via point by the PTP operation without interfering with the surroundings. Considering the transfer from the transfer source stage to the transfer destination stage, the articulated robot 1 first moves to the standby/retracted position of the transfer source stage, unloads the work 21 from the transfer source stage, and returns to the standby/retracted position of the stage, and then moves to the standby/retracted position of the transfer destination stage while holding the work 21, loads the work 21 to the transfer destination stage, and finally returns to the standby/retracted position of the transfer destination stage. The position of the articulated robot 1 before starting the transfer is considered to be the return-to-origin position or the standby/retracted position of the transfer destination stage in a previous transfer.

First, a case where the transfer source stage and the transfer destination stage belong to different quadrants will be considered. Suppose moving from the standby/retracted position of the transfer source stage to the specified via point of a quadrant to which the transfer source stage belongs, and then moving to the specified via point of a quadrant to which the transfer destination stage belongs, and subsequently moving to the standby/retracted position of the transfer destination stage, the movement from the standby/retracted position of the transfer source stage to the standby/retracted position of the transfer destination stage can be executed only by PTP operation going through two specified via points. With regard to a load and(or) unload movement of the work 21 between the stage and the standby/retracted position of the stage, it is necessary to individually perform teaching such that the articulated robot 1 does not interfere with the surroundings. However, with regard to the movement of the stage between the standby/retracted positions, teaching by PTP operation with a minimum number of via points becomes possible. In a conventional way without introducing a concept of the "via point", it has been necessary to set a large number of via points by trial and error. Therefore, according to this embodiment, by specifying the specified via point for each quadrant, teaching and safety confirmation become considerably easy. Before starting transfer, it is necessary to move, from the return-to-origin position or the standby/retracted position which is the previous transfer end position, to the standby/retracted position of the transfer source stage. However, this can also be achieved by PTP operation by going through the specified via point. The same is true for a case of returning to the return-to-origin position after the end of transfer.

When the stages of the transfer source and the transfer destination are in a same quadrant, movement from the standby/retracted position of the transfer source stage to the standby/retracted position of the transfer destination stage can be executed only by PTP operation without going through the specified via point. Therefore, also in this case, with regard to the movement of the stage between standby/retracted positions, teaching by PTP operation with a minimum number of via points becomes possible.

Effects of the Present Embodiment

As described above, in the work transfer system of this embodiment, when setting the transfer path of the work 21, with regard to the load and(or) unload movement on a stage from the standby/retracted position of the stage, although it is necessary to set the transfer path of the horizontal articulated robot 1 individually, other movements in the transfer of the work 21 can be achieved by PTP operation going through a minimum number of specified via points. Therefore, according to this embodiment, it is possible to reduce an amount of teaching work as a whole, and to set a transfer path that can achieve high-speed transfer with a small number of via points.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A work transfer system for use with a work, the work transfer system comprising:
   plurality of cassettes configured to house the work;
   a work processing apparatus configured to process the work; and
   a horizontal articulated robot configured to load and unload the work to the plurality of cassettes,
   wherein the horizontal articulated robot comprises a base, a base side link rotatably connected to the base, an arm section side link coupled to the base side link, an arm section freely rotatably connected to the arm section side link, and a hand section freely rotatably connected to the arm section to hold the work,
   wherein the base side link and the arm section side link constitute a link mechanism configured to control a movement locus of a center point of a coupling shaft coupling the arm section side link and the arm section to correspond to a predetermined straight line,
   wherein the plurality of cassettes are arranged parallel to the predetermined straight line and constitute one side of a boundary defining a working area of the horizontal articulated robot,
   wherein the work processing apparatus is arranged at any position on the boundary of the working area,
   wherein with a center of rotation of the base side link with respect to the base as an origin, a via point is specified for each quadrant of an XY orthogonal coordinate system so that one of two opposite directions parallel to the predetermined straight line is an X-axis positive direction in the XY orthogonal coordinate system, and
   wherein the horizontal articulated robot moves between stages that are a target of loading or unloading of the work and uses the specified via point as a via point when moving.

2. The work transfer system according to claim 1, wherein the specified via point of each quadrant is prestored in the horizontal articulated robot as being unique to the horizontal articulated robot.

3. The work transfer system according to claim 1, wherein the specified via point is determined for each quadrant such that no interference occurs by the horizontal articulated robot when moving by point to point operation between specified via points of different quadrants.

4. The work transfer system according to claim 1, wherein the specified via point is determined for each quadrant such that no interference occurs by the horizontal articulated robot when moving by point to point operation between the specified via point and a return-to-origin position of the horizontal articulated robot.

5. The work transfer system according to claim 1, wherein the specified via point is determined for each quadrant such that no interference occurs by the horizontal articulated robot when moving by point to point operation between a standby/retracted position for any stage within the quadrant and the specified via point of the quadrant.

6. The work transfer system according to claim 1,
   wherein with regard to a stage being rotated in a counterclockwise direction or a clockwise direction for a constant angle from the X-axis positive direction when viewed from the origin, one of a specified via point of a 1st quadrant and a specified via point of a 4th quadrant is selected as the via point for the stage, and
   wherein with regard to a stage being rotated in a counterclockwise direction or a clockwise direction for a constant angle from an X-axis negative direction when viewed from the origin, one of a specified via point of a 2nd quadrant and a specified via point of a 3rd quadrant is selected as the via point for the stage.

7. The work transfer system according to claim 1, wherein the predetermined straight line is positioned biased to either a side of the plurality of cassettes or a side farther away from the plurality of cassettes, with respect to a center line of a longitudinal direction of the working area.

8. The work transfer system according to claim 7, wherein when a Y-axis positive direction is specified such that a Y-coordinate of an intersection point of the center line and a Y-axis in the XY orthogonal coordinate system is negative when viewed from the origin,
   an attitude of the horizontal articulated robot at specified via points of a 1st quadrant and a 2nd quadrant is configured such that the hand section is oriented in the Y-axis positive direction, and an extending direction of the hand section is inclined toward the Y-axis when viewed from a coupling position of the hand section and the arm section, and
   the attitude of the horizontal articulated robot at specified via points of a 3rd quadrant and a 4th quadrant is configured such that there is an opening angle between the hand section and the arm section, and the extending direction of the hand section is inclined in a range of 20° to 30° toward the Y-axis when viewed from the coupling position of the hand section and the arm section.

9. A control method of a work transfer system comprising plurality of cassettes configured to house a work, a work processing apparatus configured to process the work, and a horizontal articulated robot configured to load and unload the work to the plurality of cassettes,
   the horizontal articulated robot comprising a base, a base side link rotatably connected to the base, an arm section side link coupled to the base side link, an arm section freely rotatably connected to the arm section side link, and a hand section freely rotatably connected to the arm section to hold the work, and moving between stages that are a target of load and unload of the work,
   the base side link and the arm section side link constituting a link mechanism configured to control a movement locus of a center point of a coupling shaft coupling the arm section side link and the arm section to correspond to a predetermined straight line, and
   the plurality of cassettes being arranged parallel to the predetermined straight line, the cassettes constituting one side of a boundary defining a working area of the horizontal articulated robot, and the work processing apparatus being arranged at any position on the boundary of the working area,
   wherein with a center of rotation of the base side link with respect to the base as an origin, a specified via point is specified for each quadrant of an XY orthogonal coordinate system so that one of two opposite directions parallel to the predetermined straight line is an X-axis positive direction in the XY orthogonal coordinate system, and
   wherein the horizontal articulated robot is controlled to go through one or more of the specified via point when the horizontal articulated robot moves between two stages in the work transfer system.

10. The control method according to claim 9, wherein the specified via point is determined for each quadrant such that no interference occurs by the horizontal articulated robot when moving by point to point operation between specified via points of different quadrants.

11. The control method according to claim 9, wherein the specified via point is determined for each quadrant such that no interference occurs by the horizontal articulated robot when moving by point to point operation between the specified via point and a return-to-origin position of the horizontal articulated robot.

12. The control method according to claim 9, wherein the specified via point is determined for each quadrant such that no interference occurs by the horizontal articulated robot when moving by point to point operation between a standby/retracted position for any stage within the quadrant and the specified via point of the quadrant.

13. The control method according to claim 9,
wherein with regard to a stage being rotated in a counterclockwise direction or a clockwise direction for a constant angle from the X-axis positive direction when viewed from the origin, one of a specified via point of a 1st quadrant and a specified via point of a 4th quadrant is selected as a via point for the stage, and
wherein with regard to a stage being rotated in a counterclockwise direction or a clockwise direction for a constant angle from an X-axis negative direction when viewed from the origin, one of a specified via point of a 2nd quadrant and a specified via point of a 3rd quadrant is selected as a via point for the stage.

14. The control method according to claim 9, wherein the predetermined straight line is positioned biased to either a side of the plurality of cassettes or a side farther away from the plurality of cassettes, with respect to a center line of a longitudinal direction of the working area.

15. The control method according to claim 14, wherein when a Y-axis positive direction is specified such that a Y-coordinate of an intersection point of the center line and a Y-axis in the XY orthogonal coordinate system is negative when viewed from the origin,
at specified via points of a 1st quadrant and a 2nd quadrant, an attitude of the horizontal articulated robot is configured such that the hand section is oriented in the Y-axis positive direction, and an extending direction of the hand section is inclined toward the Y-axis when viewed from a coupling position of the hand section and the arm section, and
at specified via points of a 3rd quadrant and a 4th quadrant, the attitude of the horizontal articulated robot is configured such that there is an opening angle between the hand section and the arm section, and the extending direction of the hand section is inclined in a range of 20° to 30° toward the Y-axis when viewed from a coupling position of the hand section and the arm section.

* * * * *